(12) United States Patent
Ho et al.

(10) Patent No.: US 8,826,213 B1
(45) Date of Patent: Sep. 2, 2014

(54) PARASITIC CAPACITANCE EXTRACTION FOR FINFETS

(71) Applicant: Taiwan Semiconductor Manufacturing Company, Ltd., Hsin-Chu (TW)

(72) Inventors: Chia-Ming Ho, Hsin-Chu (TW); Ke-Ying Su, Taipei (TW); Hsiao-Shu Chao, Baoshan Township (TW); Yi-Kan Cheng, Taipei (TW); Ze-Ming Wu, Tainan (TW); Hsien-Hsin Sean Lee, Duluth, GA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/873,969

(22) Filed: Apr. 30, 2013

Related U.S. Application Data

(60) Provisional application No. 61/776,738, filed on Mar. 11, 2013.

(51) Int. Cl.
*G06F 17/50* (2006.01)
(52) U.S. Cl.
CPC .................. *G06F 17/5072* (2013.01)
USPC ............ 716/122; 716/110; 716/111; 716/136
(58) Field of Classification Search
CPC ............ H01L 29/785; H01L 29/66795; G01B 2210/56
USPC .......................... 716/110, 111, 115, 122, 136
See application file for complete search history.

(56) References Cited

U.S. PATENT DOCUMENTS

| | | | | |
|---|---|---|---|---|
| 4,430,583 | A * | 2/1984 | Shoji | 326/119 |
| 8,043,920 | B2 * | 10/2011 | Chan et al. | 438/300 |
| 8,214,784 | B2 | 7/2012 | Su et al. | |
| 8,484,599 | B2 * | 7/2013 | Sundaresan | 716/115 |
| 8,495,532 | B2 * | 7/2013 | Su et al. | 716/101 |
| 8,572,537 | B2 * | 10/2013 | Su et al. | 716/115 |
| 8,637,384 | B2 * | 1/2014 | Ando et al. | 438/479 |
| 8,637,930 | B2 * | 1/2014 | Ando et al. | 257/347 |
| 2014/0019930 | A1 * | 1/2014 | Yuh et al. | 716/115 |

\* cited by examiner

*Primary Examiner* — Sun Lin
(74) *Attorney, Agent, or Firm* — Slater and Matsil, L.L.P.

(57) ABSTRACT

A method includes generating a three-dimensional table. The table cells of the three-dimensional table comprise normalized parasitic capacitance values selected from the group consisting essentially of normalized poly-to-fin parasitic capacitance values and normalized poly-to-metal-contact parasitic capacitance values of Fin Field-Effect Transistors (FinFETs). The three-dimensional table is indexed by poly-to-metal-contact spacings of the FinFETs, fin-to-fin spacings of the FinFETs, and metal-contact-to-second-poly spacings of the FinFETs. The step of generating the three-dimensional table is performed using a computer.

20 Claims, 9 Drawing Sheets

TABLE 1-A (S3 = 1X)

| NORMALIZED $C_{gf}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $C_{1,1,1}$ | $C_{1,1.5,1}$ | $C_{1,2,1}$ | $C_{1,2.5,1}$ | $C_{1,3,1}$ |
| | 1.5X | $C_{1.5,1,1}$ | $C_{1.5,1.5,1}$ | $C_{1.5,2,1}$ | $C_{1.5,2.5,1}$ | $C_{1.5,3,1}$ |
| | 2X | $C_{2,1,1}$ | $C_{2,1.5,1}$ | $C_{2,2,1}$ | $C_{2,2.5,1}$ | $C_{2,3,1}$ |
| | 2.5X | $C_{2.5,2,1}$ | $C_{2.5,1.5,1}$ | $C_{2.5,2,1}$ | $C_{2.5,2.5,1}$ | $C_{2.5,3,1}$ |
| | 3X | $C_{3,2,1}$ | $C_{3,1.5,1}$ | $C_{3,2,1}$ | $C_{3,2.5,1}$ | $C_{3,3,1}$ |
| | 5X | $C_{5,2,1}$ | $C_{5,1.5,1}$ | $C_{5,2,1}$ | $C_{5,2.5,1}$ | $C_{5,3,1}$ |

FIG. 3A

TABLE 1-B (S3 = 2X)

| NORMALIZED $C_{gf}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $C_{1,1,2}$ | $C_{1,1.5,2}$ | $C_{1,2,2}$ | $C_{1,2.5,2}$ | $C_{1,3,2}$ |
| | 1.5X | $C_{1.5,1,2}$ | $C_{1.5,1.5,2}$ | $C_{1.5,2,2}$ | $C_{1.5,2.5,2}$ | $C_{1.5,3,2}$ |
| | 2X | $C_{2,1,2}$ | $C_{2,1.5,2}$ | $C_{2,2,2}$ | $C_{2,2.5,2}$ | $C_{2,3,2}$ |
| | 2.5X | $C_{2.5,2,2}$ | $C_{2.5,1.5,2}$ | $C_{2.5,2,2}$ | $C_{2.5,2.5,2}$ | $C_{2.5,3,2}$ |
| | 3X | $C_{3,2,2}$ | $C_{3,1.5,2}$ | $C_{3,2,2}$ | $C_{3,2.5,2}$ | $C_{3,3,2}$ |
| | 5X | $C_{5,2,2}$ | $C_{5,1.5,2}$ | $C_{5,2,2}$ | $C_{5,2.5,2}$ | $C_{5,3,2}$ |

FIG. 3B

TABLE 1-C (S3 = 3X)

| NORMALIZED $C_{gf}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $c_{1,1,3}$ | $c_{1,1.5,3}$ | $c_{1,2,3}$ | $c_{1,2.5,3}$ | $c_{1,3,3}$ |
| | 1.5X | $c_{1.5,1,3}$ | $c_{1.5,1.5,3}$ | $c_{1.5,2,3}$ | $c_{1.5,2.5,3}$ | $c_{1.5,3,3}$ |
| | 2X | $c_{2,1,3}$ | $c_{2,1.5,3}$ | $c_{2,2,3}$ | $c_{2,2.5,3}$ | $c_{2,3,3}$ |
| | 2.5X | $c_{2.5,2,3}$ | $c_{2.5,1.5,3}$ | $c_{2.5,2,3}$ | $c_{2.5,2.5,3}$ | $c_{2.5,3,3}$ |
| | 3X | $c_{3,2,3}$ | $c_{3,1.5,3}$ | $c_{3,2,3}$ | $c_{3,2.5,3}$ | $c_{3,3,3}$ |
| | 5X | $c_{5,2,3}$ | $c_{5,1.5,3}$ | $c_{5,2,3}$ | $c_{5,2.5,3}$ | $c_{5,3,3}$ |

FIG. 3C

TABLE 2-A (S3 = 1X)

| NORMALIZED $C_{gm}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $c_{1,1,1}$ | $c_{1,1.5,1}$ | $c_{1,2,1}$ | $c_{1,2.5,1}$ | $c_{1,3,1}$ |
| | 1.5X | $c_{1.5,1,1}$ | $c_{1.5,1.5,1}$ | $c_{1.5,2,1}$ | $c_{1.5,2.5,1}$ | $c_{1.5,3,1}$ |
| | 2X | $c_{2,1,1}$ | $c_{2,1.5,1}$ | $c_{2,2,1}$ | $c_{2,2.5,1}$ | $c_{2,3,1}$ |
| | 2.5X | $c_{2.5,2,1}$ | $c_{2.5,1.5,1}$ | $c_{2.5,2,1}$ | $c_{2.5,2.5,1}$ | $c_{2.5,3,1}$ |
| | 3X | $c_{3,2,1}$ | $c_{3,1.5,1}$ | $c_{3,2,1}$ | $c_{3,2.5,1}$ | $c_{3,3,1}$ |
| | 5X | $c_{5,2,1}$ | $c_{5,1.5,1}$ | $c_{5,2,1}$ | $c_{5,2.5,1}$ | $c_{5,3,1}$ |

FIG. 4A

TABLE 2-B (S3 = 2X)

| NORMALIZED $C_{gm}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $C_{1,1,2}$ | $C_{1,1.5,2}$ | $C_{1,2,2}$ | $C_{1,2.5,2}$ | $C_{1,3,2}$ |
| | 1.5X | $C_{1.5,1,2}$ | $C_{1.5,1.5,2}$ | $C_{1.5,2,2}$ | $C_{1.5,2.5,2}$ | $C_{1.5,3,2}$ |
| | 2X | $C_{2,1,2}$ | $C_{2,1.5,2}$ | $C_{2,2,2}$ | $C_{2,2.5,2}$ | $C_{2,3,2}$ |
| | 2.5X | $C_{2.5,2,2}$ | $C_{2.5,1.5,2}$ | $C_{2.5,2,2}$ | $C_{2.5,2.5,2}$ | $C_{2.5,3,2}$ |
| | 3X | $C_{3,2,2}$ | $C_{3,1.5,2}$ | $C_{3,2,2}$ | $C_{3,2.5,2}$ | $C_{3,3,2}$ |
| | 5X | $C_{5,2,2}$ | $C_{5,1.5,2}$ | $C_{5,2,2}$ | $C_{5,2.5,2}$ | $C_{5,3,2}$ |

FIG. 4B

TABLE 2-C (S3 = 3X)

| NORMALIZED $C_{gm}$ | | FIN-TO-METAL-CONTACT SPACING (S1) | | | | |
|---|---|---|---|---|---|---|
| | | 1X | 1.5X | 2X | 2.5X | 3X |
| FIN-TO-FIN SPACING (S2) | 1X | $C_{1,1,3}$ | $C_{1,1.5,3}$ | $C_{1,2,3}$ | $C_{1,2.5,3}$ | $C_{1,3,3}$ |
| | 1.5X | $C_{1.5,1,3}$ | $C_{1.5,1.5,3}$ | $C_{1.5,2,3}$ | $C_{1.5,2.5,3}$ | $C_{1.5,3,3}$ |
| | 2X | $C_{2,1,3}$ | $C_{2,1.5,3}$ | $C_{2,2,3}$ | $C_{2,2.5,3}$ | $C_{2,3,3}$ |
| | 2.5X | $C_{2.5,2,3}$ | $C_{2.5,1.5,3}$ | $C_{2.5,2,3}$ | $C_{2.5,2.5,3}$ | $C_{2.5,3,3}$ |
| | 3X | $C_{3,2,3}$ | $C_{3,1.5,3}$ | $C_{3,2,3}$ | $C_{3,2.5,3}$ | $C_{3,3,3}$ |
| | 5X | $C_{5,2,3}$ | $C_{5,1.5,3}$ | $C_{5,2,3}$ | $C_{5,2.5,3}$ | $C_{5,3,3}$ |

FIG. 4C

PARASITIC CAPACITANCE EXTRACTION FOR FINFETS

This application claims the benefit of the following provisionally filed U.S. patent application: Application Ser. No. 61/776,738, filed Mar. 11, 2013, and entitled "Parasitic Capacitance Extraction for FinFETs," which application is hereby incorporated herein by reference.

BACKGROUND

Integrated circuits ("ICs") vary in complexity from, for example, an analog circuit comprising a few basic electronic components, such as transistors and diodes, to a complex digital system including hundreds of millions of transistors. Although different design methods and Electronic Design Automation ("EDA") tools are arranged to design ICs of various levels of complexity, the fundamental process of IC design remains unchanged. That is, IC design engineers design an integrated circuit by transforming a circuit specification into geometric descriptions of physical components that in combination form the basic electronic components. In general, the geometric descriptions are polygons of various dimensions, representing conductive features located in different processing layers. The detailed geometric descriptions of physical components are generally referred to as integrated circuit layouts. After the creation of an initial integrated circuit layout, the integrated circuit layout is usually tested and optimized through a set of steps in order to verify that the integrated circuit meets the design specification and will perform as desired.

In a typical post-design testing and optimization step, after an integrated circuit design process is completed, an initial integrated circuit layout is created. The layout is first checked against design rules and then verified to be equivalent to the desired design schematic. This step is generally referred to as Design-Rule Check (DRC) and Layout Versus Schematic (LVS).

A step of RC extraction is subsequently performed in order to "extract" electrical characteristics of the layout. The common electrical characteristics that are extracted from an integrated circuit layout include capacitance and resistance in the electronic devices and on the various interconnects (also generally referred to as "nets") that electrically connect the aforementioned devices. This step is also referred to as "parasitic extraction" because these capacitance and resistance values are not intended by the designer but rather result from the underlying device physics of the device configurations and materials used to fabricate the IC.

The designed IC is then simulated to insure the design meets the specification with the parasitic capacitance and resistance in the IC. If the parasitic capacitance and resistance cause undesirable performance, the integrated circuit layout is typically changed through one or more design optimization cycles. If the simulation results satisfy the design specification, the design process is completed.

It is known that the parasitic capacitance and resistance can cause various detrimental effects in a designed IC, such as undesired long signal delays on the nets. Thus, the impact of the parasitic capacitance and resistance on the performance of the designed IC must be accurately predicted so that design engineers can compensate for these detrimental effects through proper design optimization steps.

It is also recognized that, when device feature sizes shrink down to the ultra-deep submicron range (less than 0.25 micron), interconnect delays begin to dominate the total delay in an IC. Moreover, when FinFET technology is used, the parasitic capacitance between gate electrodes and semiconductor fins also plays an important role in the parasitic capacitance in additional to the parasitic capacitance between gate electrodes and metal contacts. Existing EDA tools, however, are not designed to handle the complex parasitic in the FinFETs.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3A, 3B, and 3C illustrate a three-dimensional lookup table of FinFETs, wherein normalized parasitic poly-to-fin capacitance values of the FinFETs are illustrated as the functions of various spacings in the FinFETs;

FIGS. 4A, 4B, and 4C illustrate a three-dimensional lookup table of FinFETs, wherein normalized parasitic poly-to-metal-contact capacitance values of the FinFETs are illustrated as the functions of various spacings in the FinFETs;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method of determining parasitic capacitances for Fin Field-Effect Transistors (FinFETs) is provided in accordance with various exemplary embodiments. The variations of the embodiments are discussed. Throughout the various views and illustrative embodiments, like reference numbers are used to designate like elements.

Figure 1:
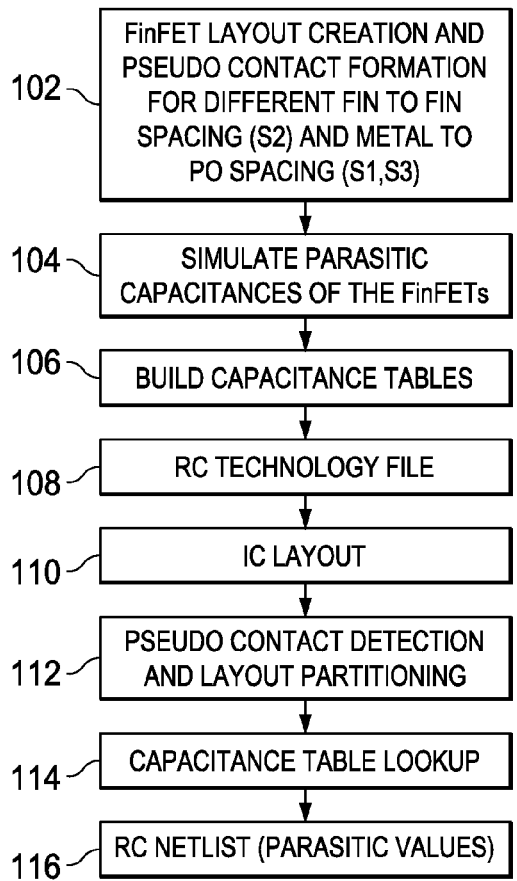
FIG. 1 illustrates a flow chart for generating parasitic capacitance lookup tables in accordance with some exemplary embodiments.

FIG. 1 illustrates a flow chart for generating parasitic capacitance lookup tables, and using the parasitic capacitance lookup tables to generate Resistance-Capacitance (RC) netlists of FinFETs. The subsequently discussed process steps are addressed referring to the flow chart shown in FIG. 1.

Figure 2A:
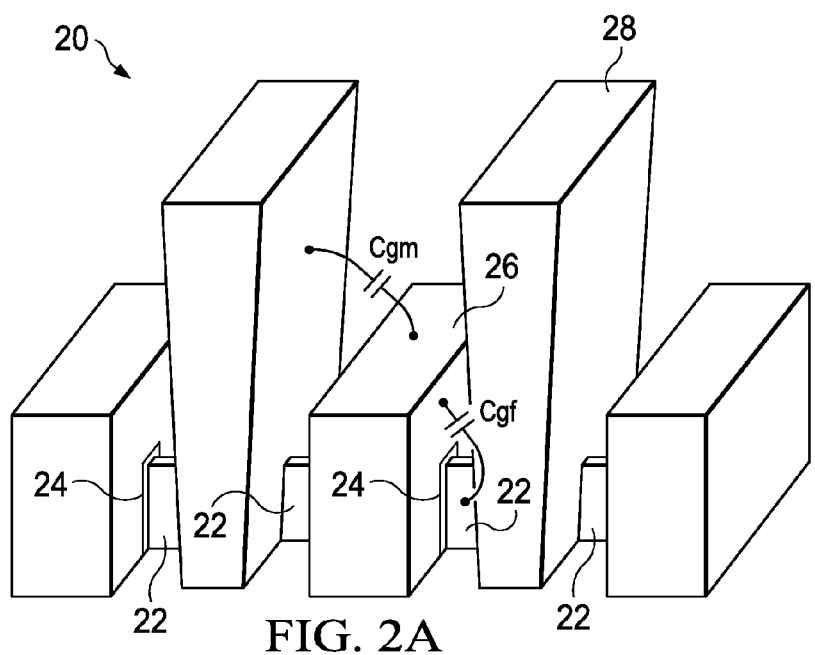
FIGS. 2A and 2B illustrate a schematic perspective view and a top view, respectively, of a Fin Field-Effect Transistor (FinFET) in accordance with some exemplary embodiments.
Figure 2B:
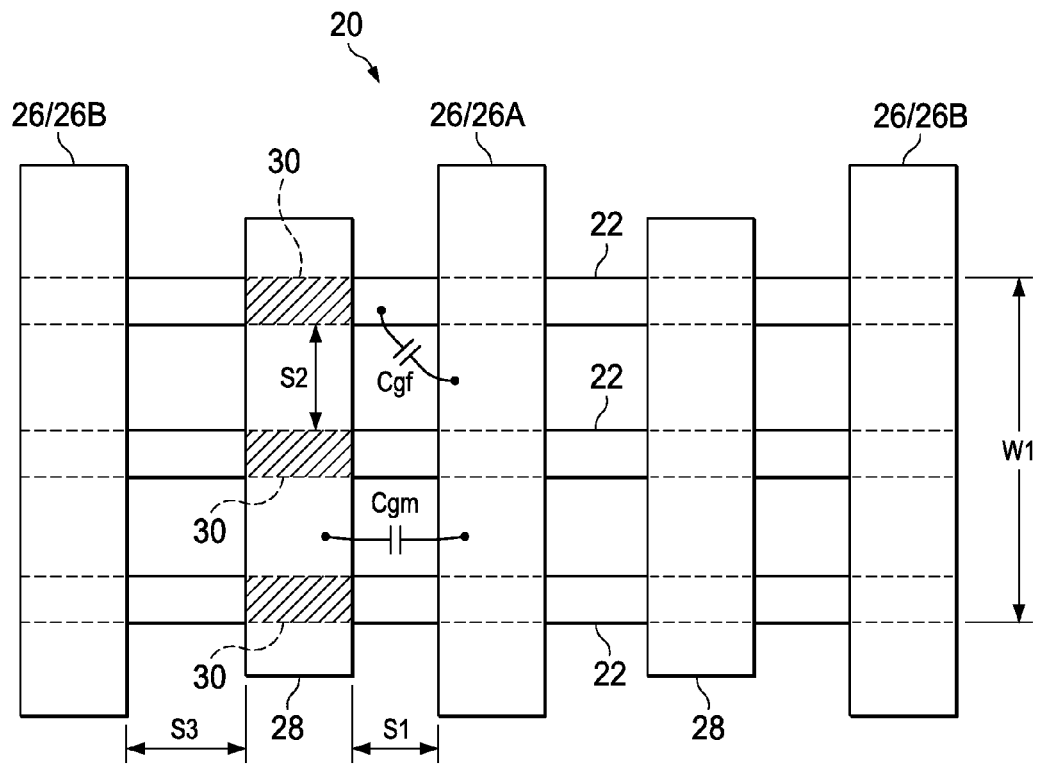

FIG. 2A illustrates a schematic perspective view of FinFET 20, whose parasitic capacitance is to be extracted using the methods in accordance with the embodiments of the present disclosure. FinFET 20 includes semiconductor fins 22, wherein gate dielectrics 24 are formed on the top surfaces and sidewalls of semiconductor fins 22. FIG. 2B illustrates a top view of FinFET 20. As shown in FIG. 2B, FinFET 20 includes a plurality of parallel fins 22. Gate electrodes 26 are formed over gate dielectric 24, and cross over the plurality of parallel fins 22. In some embodiments, gate electrodes 26 comprise polysilicon, and hence are sometimes referred to using the term "poly," "poly gate" or "PO," although gate electrodes 26 may also be formed of other conductive materials such as metals, metal silicides, or the like.

As shown in FIGS. 2A and 2B, metal contacts 28 cross over, and are electrically coupled to the plurality of fins 22. Metal contacts 28 are formed as slot contacts that are electrically coupled to the plurality of fins 22. The portions of fins 22 electrically coupled to metal contacts 28 are parts of the source and drain (referred to as source/drain hereinafter) regions of FinFET 20.

Figure 2C:
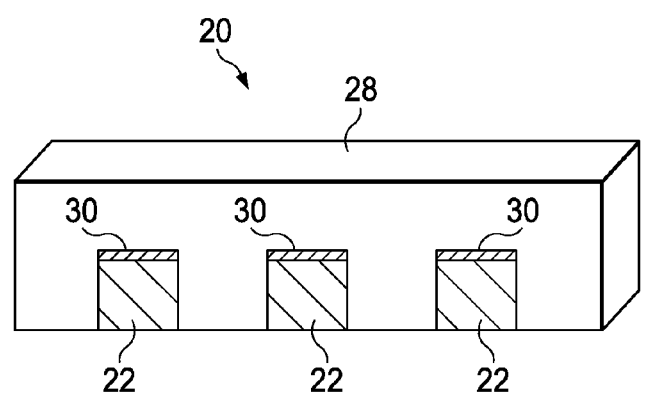
FIG. 2C schematically illustrates a perspective view of pseudo contacts in the FinFET.

In the layouts of the integrated circuits that include FinFET 20, the layouts of fins 22 and metal contacts 28 are included in different layers of the layouts. There is no layer, however, to mark the location where metal contacts 28 overlap semiconductor fins 22. Accordingly, in accordance with some exemplary embodiments, pseudo contacts 30 (FIG. 2B) are generated in the layout files, which may be in a Graphic Database System (GDS) format. The positions and the sizes of pseudo contacts 30 may be used to extract the relative positions and some sizes of FinFET 20. For example, through pseudo contacts 30, the positions and the widths of metal contacts 28 and fins 22, spacing S1 between poly gate 26 (also marked as 26A) and metal contact 28, spacing S2 between fins 22, and spacing S3 between metal contact 28 and a neighboring conductive line (also marked as 26B) may be extracted and used in the embodiments. Throughout the description, spacings S1, S2, and S3 are also referred to as a poly-to-metal-contact spacing, a fin-to-fin spacing, and a metal-contact-to-second-poly spacing, respective. Conductive lines 26B may be gate electrodes, or may be dummy gate electrodes. FIG. 2C schematically illustrates a perspective view of pseudo contacts 30, fins 22, and metal contact 28. It is appreciated that pseudo contacts 30 are generated in the layout files, and are not actual features formed on wafers.

Referring back to FIG. 2A, parasitic capacitance exists between gate electrode 26 and fins 22, which parasitic capacitance is referred to as poly-to-fin capacitance hereinafter, and is denoted as Cgf. Capacitance Cgf includes two components, including a first capacitance between gate electrode 26 and the top surfaces of fins 22, and a second capacitance between gate electrode 26 and two sidewalls of fins 22. Capacitance Cgf is the sum of the first capacitance and the second capacitance. In addition, parasitic capacitance also exists between gate electrode 26 and metal contacts 28, which parasitic capacitance is referred to a poly-to-metal-contact capacitance, and is denoted as Cgm.

Each of capacitances Cgf and Cgm is a function of spacings S1, S2, and S3 (FIG. 2B). In accordance with the embodiments of the present disclosure, a plurality of sample FinFET layouts are created, which have the structures similar to what is shown in FIGS. 2A, 2B, and 2C. The plurality of sample FinFET layouts have different spacings S1, S2, and S3 in different combinations. Pseudo contacts 30 are then generated for the sample FinFET layouts. The respective step is shown as step 102 in the process flow in FIG. 1.

In some embodiments, a minimum spacing is selected for the sample FinFETs. The minimum spacing may be determined by the technology used for manufacturing the FinFETs, and may be the minimum spacing that can be achieved when the FinFETs are manufactured on physical wafers using the respective technology. Spacings S1, S2, and S3 are selected to be equal to the minimum spacing (expressed as 1×) or equal to multiple times the minimum spacing. In some embodiments, the multiple times may be equal to an integer (N) times the minimum spacing (expressed as N×), or may be equal to an integer times the minimum spacing plus a half of the minimum spacing, which is expressed as (N+0.5) times the minimum spacing (expressed as (N+0.5)×).

Next, as shown as step 104 in FIG. 1, the parasitic capacitances Cgf and Cgm of the sample FinFETs are found, for example, through simulation. Each of the sample FinFETs has a set of spacings S1, S2, and S3. One capacitance Cgf and one capacitance Cgm can be simulated for each of the sample FinFETs. Accordingly, from the plurality of sample FinFETs, a plurality of capacitances Cgf and Cgm is generated. The resulting Cgf and Cgm and the respective S1, S2, and S3 values may then be used to construct three-dimensional tables (step 106 in FIG. 1) Table 1 and Table 2, which are shown in FIGS. 3A through 4C. The first three-dimensional table (Table 1, which includes two-dimensional tables 1-A, 1-B, and 1-C) stores the values of capacitances Cgf of the sample FinFETs, wherein capacitances Cgf are indexed by spacings S1, S2, and S3. The second three-dimensional table (Table 2, which includes two-dimensional tables 2-A, 2-B, and 2-C) stores the values of capacitances Cgm of the sample FinFETs, wherein capacitances Cgm are also indexed by spacings S1, S2, and S3. In accordance with some embodiments, spacings S1 and S2 are used to index to the table cells in each of the two-dimensional tables, and spacing S3 is used to index to the plurality of two-dimensional tables. It is realized other indexing schemes may be used. For example, the indexing to the plurality of two-dimensional tables may be through spacing S1 or S2.

An exemplary two-dimensional table 1-A is shown in FIG. 3A, wherein the fin-to-fin spacings S2 is placed as the column index, and the poly-to-metal-contact spacing S1 is placed as the row index. The table cell values are normalized capacitances Cgf values per unit width. Spacings S1, S2, and S3 are represented as how many times (represented as "x") the minimum spacing the respective spacings S1, S2, and S3 equal to. Each of the table cells is filled with a simulated normalized capacitance value, which is represented by letter "C" followed by the values of the corresponding spacings S1, S2, and S3. Table 1-A is obtained when spacing S3 is 1×, which means spacing S3 is equal to the minimum spacing.

Similarly, Tables 1-B and 1-C are shown in FIGS. 3B and 3C, respectively. FIG. 3B illustrates the normalized capacitance Cgf (per unit width) when spacing S3 is equal to 2×. FIG. 3C illustrates the normalized capacitance Cgf (per unit width) when spacing S3 is equal to 3×. More tables may be constructed when spacing S3 is equal to other values such as 1.5×, 2.5×, 4×, and the like. All of the two-dimensional Tables (including Tables 1-A, 1-B, 1-C and possibly more) of the normalized capacitance values Cgf in combination form the three-dimensional Table 1, which is the table of capacitance values Cgf indexed by spacings S1, S2, and S3.

Table 2 includes 2-A, 2-B, and 2-C, which are illustrated in FIGS. 4A, 4B, and 4C, respectively. Tables 2-A, 2-B, and 2-C are similar to Tables 1-A, 1-B, and 1-C, respectively, except that they store normalized poly-to-metal-contact capacitance values Cgm (per unit width) indexed by spacings S1, S2, and S3. The details of Tables 2-A, 2-B, and 2-C are not discussed in detail herein. All of the two-dimensional Tables (including 2-A, 2-B, and 2-C and possibly more) of capacitance values Cgm in combination form the three-dimensional table 2, which is the table of capacitance values Cgm indexed by spacings S1, S2, and S3.

The capacitance values Cgf and Cgm are normalized values, which are the capacitance per unit width of the respective FinFET, wherein the width is measured in the direction parallel to the lengthwise direction of gate electrode 26. An example of such width is shown as width W1 in FIG. 2B. In a unit of width (for example, a micron), many fins may be disposed. Hence, when width W1 and spacings S1, S2, and S3 of FinFET 20 (FIG. 2B) are extracted, the actual capacitances Cgf of FinFET 20 (FIG. 2B) may be calculated by indexing to Table 1 using spacings S1, S2, and S3 to find the respective table cell value, and multiplying the respective table cell value by width W1. For example, in FIG. 2B, assuming spacings S1, S2, and S3 are equal to 1×, 2×, and 1.5×, respectively, the respective table value is $C_{1, 2, 1.5}$.

Referring back to FIG. 1, when tables 1 and 2 are constructed (step 108), RC technology files may be constructed. As is known in the art, a technology file is usually used to provide process technology information into various extraction EDA tools. The information may include design rules for device placement and interconnect routing, process information for the interconnect layers, thicknesses of conductive layers, and resistivity values of the conductive layers. Tables 1 and 2 (FIGS. 3A through 4C) are incorporated as a part of the technology files for future lookup, which step is shown as step 108 in FIG. 1.

Referring again to FIG. 1, in step 110, a layout of an Integrated Circuit (IC) is provided by a designer. Next, as shown in step 112, the IC layout is partitioned, for example, into portions that include a plurality of FinFETs, which are similar to FinFET 20 in FIGS. 2A-2C and FIG. 5. For each of the FinFETs, pseudo contacts are generated, and spacings S1, S2, and S3 are extracted, so that Tables 1 and 2 may be looked up (step 114) to find the normalized capacitance values Cgf and Cgm for each of the FinFETs. The normalized capacitance values Cgf and Cgm are multiplied by the widths of the respective FinFETs, so that the parasitic capacitance values of the FinFETs are found. The capacitance values of the FinFETs are then incorporated into the RC netlist of the IC layout (step 116).

Figure 5:
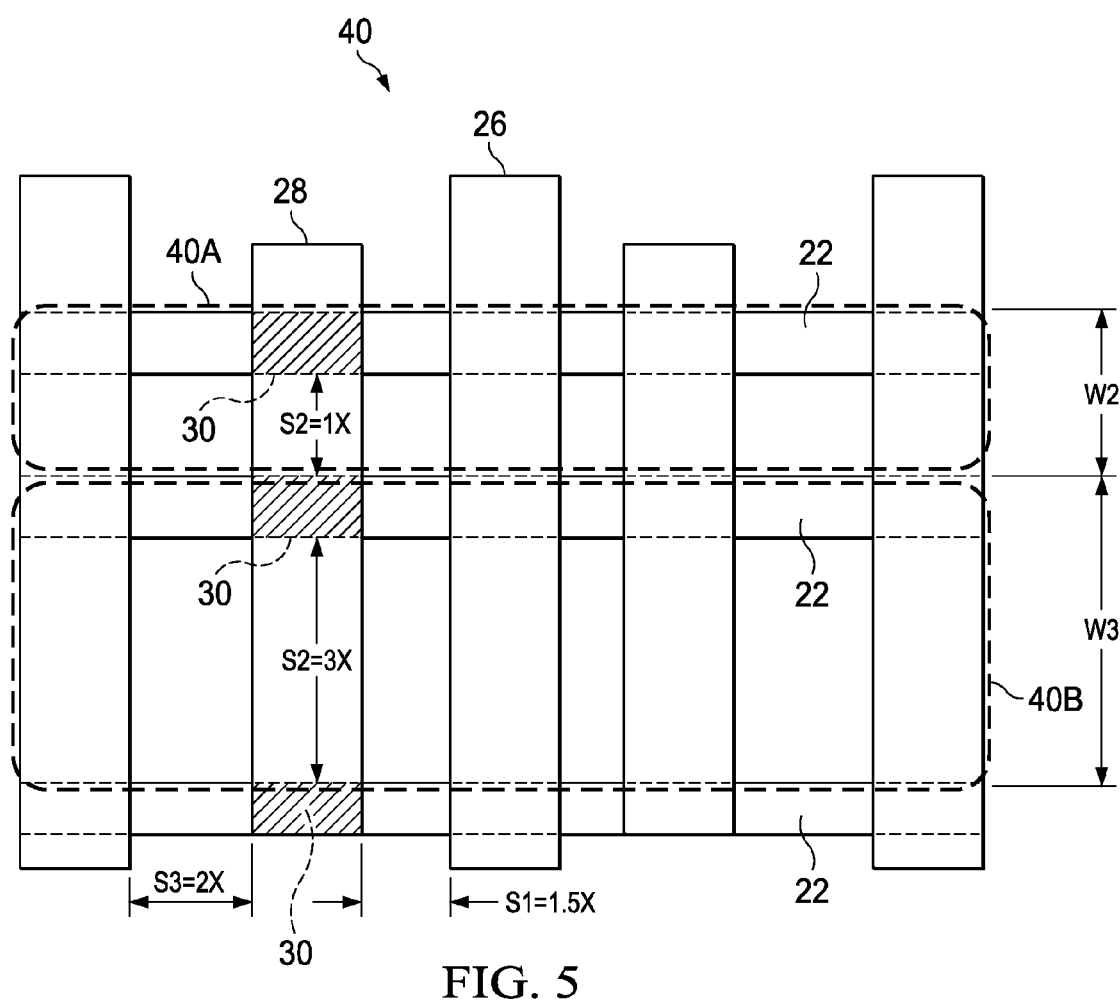
FIG. 5 illustrates a FinFET having non-uniform fin spacings.

The capacitances of FinFETs with irregular shapes may also be calculated using the three-dimensional capacitance tables 1 and 2. For example, FIG. 5 illustrates an exemplary FinFET 40 having non-uniform fin spacings. Accordingly, FinFFT 40 may be partitioned. In the illustrated example, FinFFT 40 is portioned to include region 40A and region 40B. Spacings S1, S2, and S3 in region 40A are equal to 1.5×, 1×, and 2×, respectively. Spacings S1, S2, and S3 in region 40B are equal to 1.5×, 3×, and 2×, respectively. Hence, the parasitic capacitance Cgf of the portion of FinFET 40 in region 40A is equal to $(C_{1.5,1,2} \times W2 + C_{1.5,3,2} \times W3)$, wherein the values $C_{1.5,1,2}$ and $C_{1.5,3,2}$ are found by indexing into Table 1. Similarly, the parasitic capacitance Cgm of the portion of FinFET 40 in region 40B is equal to $(C_{1.5,1,2} \times W2 + C_{1.5,3,2} \times W3)$, wherein the values $C_{1.5,1,2}$ and $C_{1.5,3,2}$ are found by indexing into Table 2.

Figure 6:
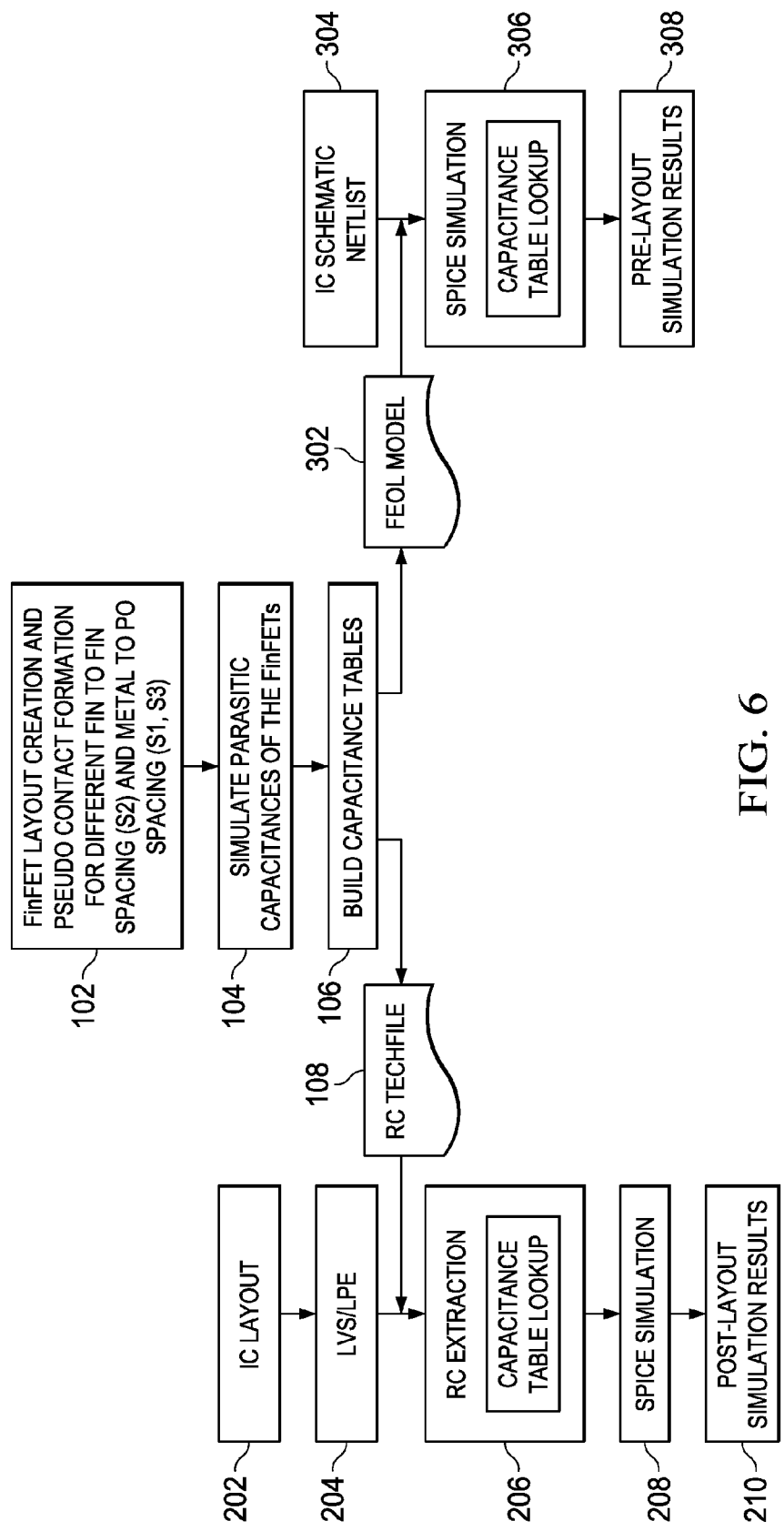
FIG. 6 illustrates a process flow for simulating integrated circuits in accordance with some embodiments.

FIG. 6 illustrates a process flow for simulating integrated circuits. The process flow includes the flow for pre-layout simulation, which is performed on the schematic circuit diagram of an integrated circuit. The process flow also includes the flow for post-layout simulation, which is performed on the layout of the integrated circuit. Steps 102, 104, 106, and 108 are essentially the same as in FIG. 1, and hence the details of these steps are not repeated herein. As shown in step 202, a layout of the integrated circuit is generated from the schematic (which is a schematic circuit diagram) of the integrated circuit, and the respective pseudo contacts are created. Next, in step 204, a Layout Versus Schematic (LVS) comparison is performed to ensure that the layout correctly reflects the schematic of the integrate circuit. A Layout Parameter Extraction (LPE) is also performed to extract the parameters (such as sizes, spacings, or the like) of the layout, during which spacings S1, S2, and S3, and the FinFET widths are extracted. Next, an RC extraction is performed (step 206) to extract the parasitic capacitance of the circuit. The parasitic capacitance of FinFETs in the integrated circuit is also extracted in this step in accordance with the aforementioned methods. The extraction includes the lookup of Tables 1 and 2 (FIGS. 3A-4C), and calculating the poly-to-fin capacitance Cgf and poly-to-metal-contact capacitance Cgm using the values in Tables 1 and 2 by multiplying the looked up table values by the FinFET widths. In step 208, a (SPICE) simulation of the integrated circuit is performed to determine the performance of the integrated circuit such as the timing, the drive currents, or the like. The simulation results are then recorded (step 210). Steps 102 through 108 steps 202 through 210 are referred to as post-layout simulation steps since they are performed on the layout of the integrated circuits.

Tables 1 and 2 may also be used to perform a pre-layout simulation, and the corresponding flow chart includes steps 102, 104, 106, 302, 304, 306, and 308 in FIG. 6. Again, in the pre-layout simulation, Tables 1 and 2 (FIGS. 3A through 4C) are first constructed in steps 102, 104, and 106. Tables 1 and 2 may be incorporated into a Front-End-of-Line (FEOL) simulation model (step 302), which is the model for simulating the FEOL behavior of the integrated circuit. The FEOL behavior includes the effect of the circuit components that are underlying interconnect structures (metal lines and the respective dielectric layers). In step 304, an IC schematic netlist is provided, which netlist essentially presents the integrated circuit in the form of a circuit diagram (not the layout). Next, a simulation is performed to simulate the performance of the integrated circuit, as shown in step 306. In the simulation, although the layout of the integrated circuit is not generated yet, some parameters related to the layout of FinFETs, such as spacings S1, S2, and S3 in FIG. 2A, are estimated. The estimated values are used to index into Tables 1 and 2 to determine the parasitic capacitance of the FinFETs in the integrated circuit. Accordingly, in the simulation, the parasitic capacitance of the FinFETs is used. The pre-layout simulation results are then recorded (step 210). The pre-layout simulation results in accordance with the embodiments are more accurate than in conventional simulation methods since the pre-layout simulation results incorporate the estimated parasitic capacitance of FinFETs.

Figure 7:
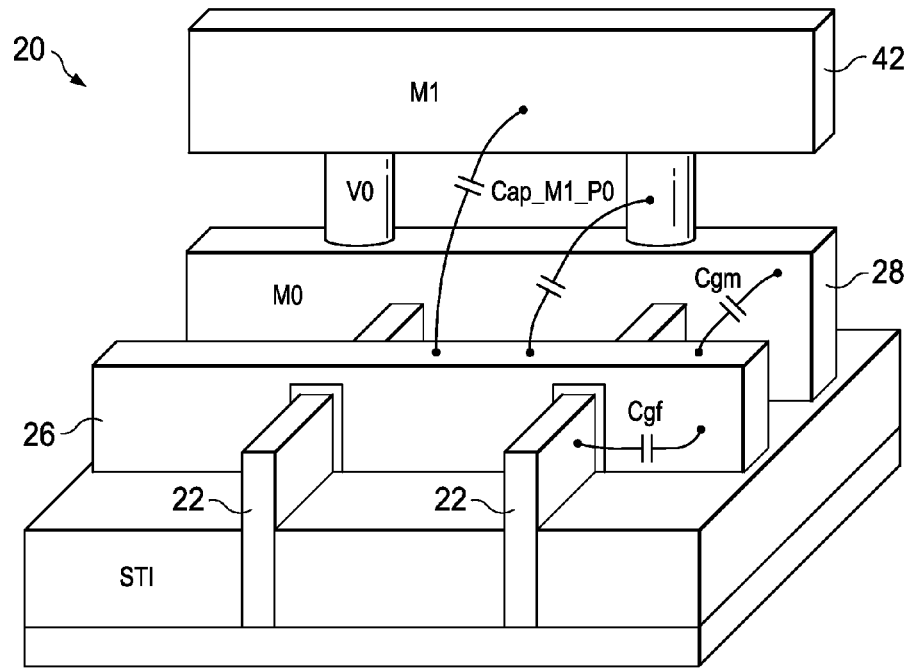
FIG. 7 illustrates a perspective view of a FinFET, wherein parasitic capacitors between various components are illustrated.
Figure 8:
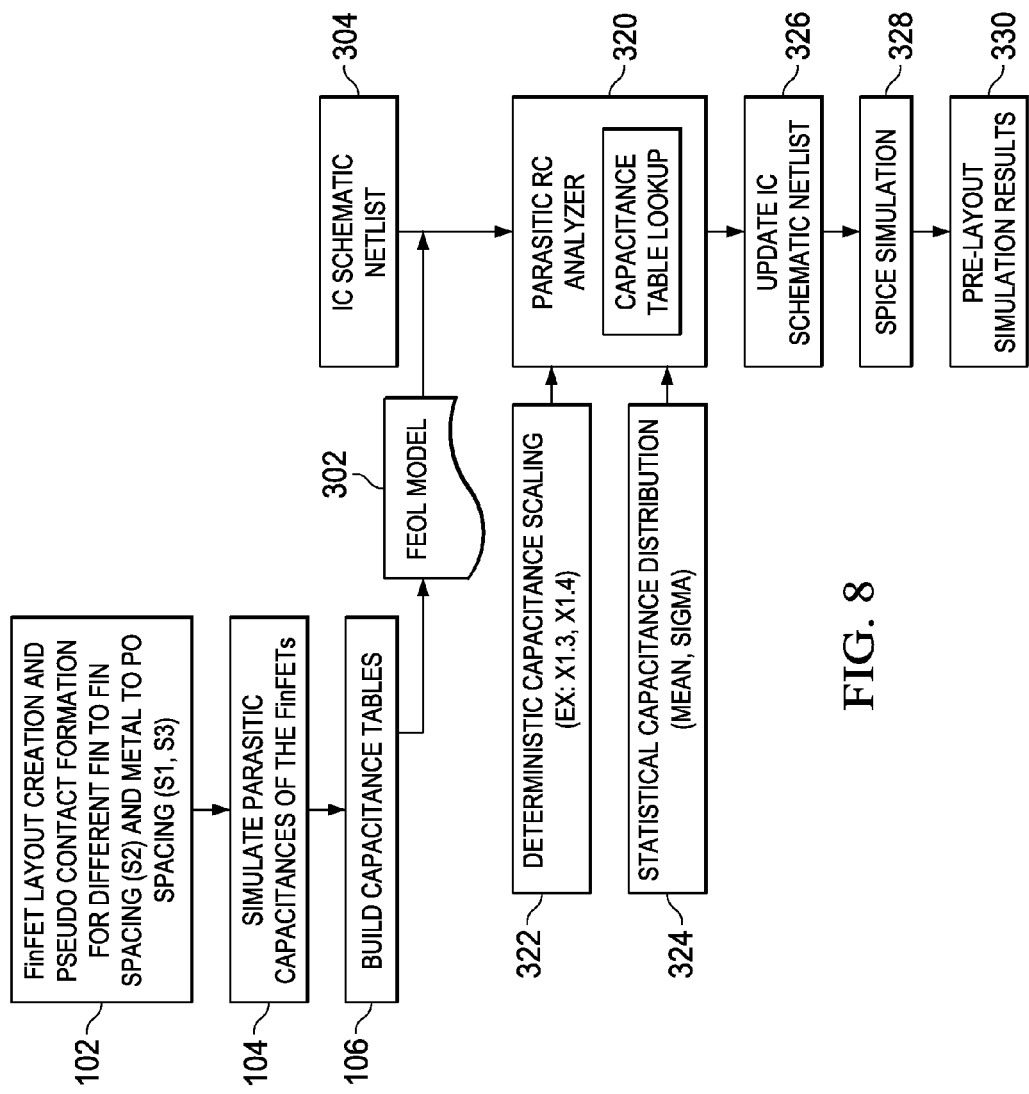
FIG. 8 illustrates a schematic flow chart for estimating the overall capacitance of FinFETs and using the estimated overall capacitance in the pre-layout simulation.

Referring to FIG. 7, the parasitic capacitance of FinFET 20, besides parasitic capacitances Cgf and Cgm, also includes additional components. For example, the parasitic capacitance Cap_M1_PO is a part of the parasitic capacitance of FinFET 20. Capacitance Cap_M1_PO is the parasitic capacitance between gate electrode 26 and metal line 42, which is the metal line in metal layer M1. Metal line 42 is connected to metal contact 28. The parasitic capacitance components account for roughly about 40 percent of the overall capacitance of FinFET 20, while capacitances Cgf and Cgm account for about 60 percent of the overall capacitance of FinFET 20. To simulate circuits more accurately, the overall capacitance may be estimated through capacitances Cgf and Cgm. FIG. 8 illustrates a schematic flow chart for estimating the overall capacitance and using the estimated overall capacitance in the pre-layout simulation.

Figure 9:
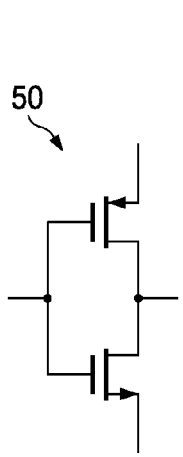
FIG. 9 illustrates a portion of the integrated circuit, wherein no parasitic capacitors and parasitic resistors are back-annotated.

Referring to FIG. 8, steps 102, 104, 106, and 302 are essentially the same as in FIGS. 1 and 6, and hence are not repeated herein. In step 304, a schematic (circuit diagram) of an integrated circuit is provided (step 304). A portion of the integrated circuit, which is represented by the IC schematic netlist, is illustrated in FIG. 9, which shows transistor 50 as an example. The parasitic resistance and capacitance of transistor 50 are not determined yet, and hence are not included in the IC schematic netlist.

Referring back to FIG. 8, in step 320, a parasitic RC analyzer is used to analyze the overall parasitic capacitance and parasitic resistance of the devices in the integrated circuit. The parasitic RC analyzer is configured to estimate the spacings S1, S2, and S3 (FIG. 2A) of the FinFETs in the integrated circuit, and use lookup Tables 1 and 2 to find the normalized parasitic capacitances Cgf and Cgm of the FinFETs in the integrated circuit. As aforementioned, parasitic capacitances Cgf and Cgm accounts for a portion (for example, about 60 percent) of the overall capacitance of the FinFETs. Hence, the overall capacitance of the FinFET may be estimated by multiplying the calculated parasitic capacitances Cgf and Cgm by a pre-determined factor, which may be between about 1.3 and about 1.5, for example, to obtain the overall parasitic capacitance of each of the FinFETs (step 322). Alternatively, as shown in step 324, a distribution of the overall capacitance of the FinFET may be estimated, wherein the estimated value includes a mean value, and the standard deviation (sigma). Again, the mean capacitance and the standard deviation are the functions of the calculated parasitic capacitances Cgf and Cgm.

Figure 10:
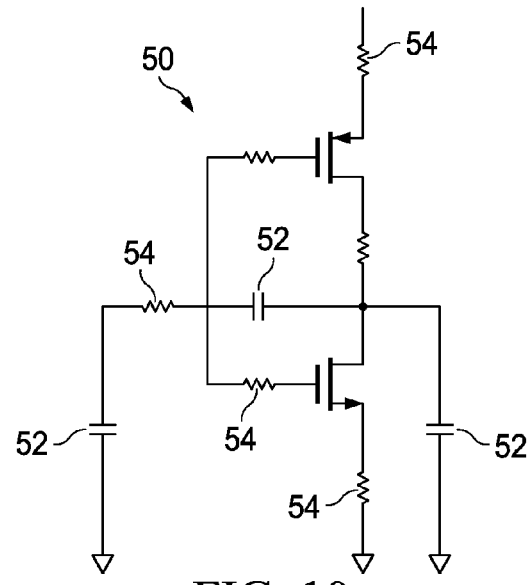
FIG. 10 illustrates a portion of the integrated circuit with the extracted parasitic capacitors and parasitic resistors being back-annotated.

After the parasitic capacitance of the integrated circuit is obtained in accordance with the embodiments, the parasitic capacitance is back annotated to the integrated circuit. The respective step is shown as step 326 in FIG. 8. FIG. 10 schematically illustrates the back-annotated transistor 50, which include parasitic capacitors 52, whose capacitances are obtained in steps 320, 322, and 324. In addition, the parasitic resistance of the integrated circuit is also retrieved by the parasitic RC analyzer. FIG. 10 also illustrates the back-annotation of the parasitic resistors 54. Next, in step 328 of FIG. 8, a simulation is performed on the back-annotated integrated circuit, which includes the parasitic capacitance and parasitic resistance obtained in steps 320, 322, and 324. The pre-layout simulation results are then recorded, as shown in step 330.

The process steps as in the embodiments may be performed by a computer(s), which includes software and hardware. The intermediate and final results of the embodiments may be saved on a tangible non-transitory computer-readable medium such as hard drives, discs, and the like. For example, Tables 1 and 2 (FIGS. 3A through 4C), the integrated circuit layout, and the generated netlists and technology files may be saved on the non-transitory computer-readable medium. In addition, each of the steps as shown in the flow charts in FIGS. 1, 6, and 8 may also be executed by a computer(s), which embodies program codes for performing the steps. The program codes may also be saved on a tangible non-transitory computer-readable medium such as hard drives, discs, and the like.

In the embodiments of the present disclosure, by constructing three-dimensional lookup tables for FinFETs, the calculation of the parasitic capacitance of the FinFETs is simplified. The embodiments of the present disclosure may be used in the pre-layout simulation to estimate the parasitic capacitance of circuits more accurately. Hence, the performance of the integrated circuits may be found in early design stages. The number of re-design iterations may thus be reduced.

In accordance with some embodiments, a method includes generating a three-dimensional table. The table cells of the three-dimensional table include normalized parasitic capacitance values selected from the group consisting essentially of normalized poly-to-fin parasitic capacitance values and normalized poly-to-metal-contact parasitic capacitance values of FinFETs. The three-dimensional table is indexed by poly-to-metal-contact spacings of the FinFETs, fin-to-fin spacings of the FinFETs, and metal-contact-to-second-poly spacings of the FinFETs. The step of generating the three-dimensional table is performed using a computer.

In accordance with other embodiments, a method includes creating pseudo contacts for FinFETs of an integrated circuit, using the pseudo contacts to determine a poly-to-metal-contact spacing, a fin-to-fin spacing, and a metal-contact-to-second-poly spacing for each of the FinFETs, and using the poly-to-metal-contact spacing, the fin-to-fin spacing, and the metal-contact-to-second-poly spacing as indices to index into a three-dimensional capacitance table. A normalized capacitance value is retrieved from a table cell indexed to by the poly-to-metal-contact spacing, the fin-to-fin spacing, and the metal-contact-to-second-poly spacing. The step of retrieving is performed by a computer.

In accordance with yet other embodiments, a method includes generating a plurality of sample FinFETs, wherein poly-to-metal-contact spacings, fin-to-fin spacings, and metal-contact-to-second-poly spacings of the plurality of sample FinFETs are different from each other. The method further includes simulating normalized poly-to-fin capacitances of the plurality of sample FinFETs, and simulating normalized poly-to-metal-contact capacitances of the plurality of sample FinFETs, wherein the steps of simulating are performed using a computer. A first three-dimensional table is constructed, wherein table cells of the first three-dimensional table are the normalized poly-to-fin capacitances. The table cells of the first three-dimensional table are indexed by the poly-to-metal-contact spacings, the fin-to-fin spacings, and the metal-contact-to-second-poly spacings. A second three-dimensional table is constructed, wherein table cells of the second three-dimensional table are the normalized poly-to-metal-contact capacitances. The table cells of the second three-dimensional table are indexed by the poly-to-metal-contact spacings, the fin-to-fin spacings, and the metal-contact-to-second-poly spacings.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
generating a three-dimensional table, wherein table cells of the three-dimensional table comprise normalized parasitic capacitance values selected from a group consisting essentially of normalized poly-to-fin parasitic capacitance values and normalized poly-to-metal-contact parasitic capacitance values of Fin Field-Effect Transistors (FinFETs), and wherein the three-dimensional table is indexed by:
poly-to-metal-contact spacings of the FinFETs;
fin-to-fin spacings of the FinFETs; and
metal-contact-to-second-poly spacings of the FinFETs, wherein the step of generating the three-dimensional table is performed using a computer.

2. The method of claim 1 further comprising generating pseudo contacts, wherein the pseudo contacts are between metal contacts of the FinFETs and fins of the FinFETs, and wherein the poly-to-metal-contact spacings, the fin-to-fin spacings, and the metal-contact-to-second-poly spacings are determined from the pseudo contacts.

3. The method of claim 1, wherein the table cells of the three-dimensional table comprise the normalized poly-to-fin parasitic capacitance values.

4. The method of claim 3 further comprising an additional three-dimensional table, wherein table cells of the additional three-dimensional table comprise normalized poly-to-metal-contact parasitic capacitance values.

5. The method of claim 1, wherein the table cells of the three-dimensional table comprise the normalized poly-to-metal-contact parasitic capacitance values.

6. The method of claim 1 further comprising:
creating pseudo contacts for FinFETs of an integrated circuit;
using the pseudo contacts to determine a poly-to-metal-contact spacing, a fin-to-fin spacing, and a metal-contact-to-second-poly spacing for each of the FinFETs; and
retrieving the normalized parasitic capacitance values by indexing into the three-dimensional table using the poly-to-metal-contact spacing, the fin-to-fin spacing, and the metal-contact-to-second-poly spacing of each of the FinFETs as indices.

7. The method of claim 6 further comprising calculating parasitic capacitances for the FinFETs by multiplying the normalized parasitic capacitance values with FinFET widths of respective FinFETs.

8. A method comprising:
creating pseudo contacts for Fin Field-Effect Transistors (FinFETs) of an integrated circuit;
using the pseudo contacts to determine a poly-to-metal-contact spacing, a fin-to-fin spacing, and a metal-contact-to-second-poly spacing for each of the FinFETs;
using the poly-to-metal-contact spacing, the fin-to-fin spacing, and the metal-contact-to-second-poly spacing as indices to index into a three-dimensional capacitance table; and
retrieving a normalized capacitance value from a table cell of the three-dimensional capacitance table indexed to by the poly-to-metal-contact spacing, the fin-to-fin spacing, and the metal-contact-to-second-poly spacing, wherein the step of retrieving is performed by a computer.

9. The method of claim 8, wherein table cells of the three-dimensional capacitance table comprise normalized parasitic capacitance values selected from the group consisting essentially of normalized poly-to-fin parasitic capacitance values and normalized poly-to-metal-contact parasitic capacitance values.

10. The method of claim 8 further comprising calculating a parasitic capacitance for the each of the FinFETs by multiplying the normalized parasitic capacitance value by a FinFET width of the each of the FinFETs.

11. The method of claim 10 further comprising:
partitioning one of the FinFETs into a plurality of FinFET regions;
calculating a sub parasitic capacitance for each of the plurality of FinFET regions; and
adding the sub parasitic capacitance of the plurality of FinFET regions to obtain a parasitic capacitance of the one of the FinFETs.

12. The method of claim 8 further comprising performing a pre-layout simulation using a schematic of the integrated circuit, wherein the normalized capacitance value is used in the pre-layout simulation, and wherein the poly-to-metal-contact spacing, the fin-to-fin spacing, and the metal-contact-to-second-poly spacing are estimated values of the FinFETs of the integrated circuit.

13. The method of claim 12 further comprising:
calculating a parasitic capacitance for the each of the FinFETs by multiplying the normalized parasitic capacitance value by a FinFET width of the each of the FinFETs;
multiplying the parasitic capacitance by a pre-determined factor to obtain an estimated overall parasitic capacitance of the each of the FinFETs;
back-annotating the estimated overall parasitic capacitance to the schematic of the integrated circuit to generate a back-annotated schematic; and
performing the pre-layout simulation on the schematic of the integrated circuit, wherein the schematic is the back-annotated schematic.

14. The method of claim 8 comprising performing a post-layout simulation of the integrated circuit, wherein the method further comprises:
retrieving the poly-to-metal-contact spacing, the fin-to-fin spacing, and the metal-contact-to-second-poly spacing from a layout of the integrated circuit.

15. A method comprising:
generating a plurality of sample Fin Field-Effect Transistors (FinFETs), wherein poly-to-metal-contact spacings, fin-to-fin spacings, and metal-contact-to-second-poly spacings of the plurality of sample FinFETs are different from each other;
simulating normalized poly-to-fin capacitances of the plurality of sample FinFETs, wherein the step of simulating is performed using a computer;
simulating normalized poly-to-metal-contact capacitances of the plurality of sample FinFETs;
constructing a first three-dimensional table, wherein table cells of the first three-dimensional table are the normalized poly-to-fin capacitances, and wherein the table cells of the first three-dimensional table are indexed by the poly-to-metal-contact spacings, the fin-to-fin spacings, and the metal-contact-to-second-poly spacings; and
constructing a second three-dimensional table, wherein table cells of the second three-dimensional table are the normalized poly-to-metal-contact capacitances, and wherein the table cells of the second three-dimensional table are indexed by the poly-to-metal-contact spacings, the fin-to-fin spacings, and the metal-contact-to-second-poly spacings.

16. The method of claim 15, wherein the first three-dimensional table comprises a plurality of tables, wherein each of the plurality of tables is indexed by two of the poly-to-metal-contact spacings, the fin-to-fin spacings, and the metal-contact-to-second-poly spacings.

17. The method of claim 16, wherein the second three-dimensional table comprises a plurality of tables, wherein each of the plurality of tables is indexed by two of the poly-to-metal-contact spacings, the fin-to-fin spacings, and the metal-contact-to-second-poly spacings.

18. The method of claim 15 further comprising creating pseudo contacts for the plurality of the sample FinFETs, wherein the pseudo contacts are overlapped regions of the metal contacts of the plurality of sample FinFETs and semiconductor fins of the respective ones of the plurality of sample FinFETs.

19. The method of claim 18 further comprising determining the poly-to-metal-contact spacings, the fin-to-fin spacings, and the metal-contact-to-second-poly spacings for the plurality of sample FinFETs using locations of the pseudo contacts.

20. The method of claim 15, wherein the normalized poly-to-fin capacitances and the normalized poly-to-metal-contact capacitances are capacitances per unit width.

\* \* \* \* \*